United States Patent [19]

Traficante

[11] 4,129,822
[45] Dec. 12, 1978

[54] WIDE-BAND NUCLEAR MAGNETIC RESONANCE SPECTROMETER

[76] Inventor: Daniel D. Traficante, 16 Fairbanks Rd., Lexington, Mass. 02173

[21] Appl. No.: 861,169

[22] Filed: Dec. 16, 1977

Related U.S. Application Data

[63] Continuation-in-part of Ser. No. 571,433, Apr. 24, 1975, Pat. No. 4,075,552.

[51] Int. Cl.² ............................................. G01R 33/08
[52] U.S. Cl. ............................. 324/0.5 AH; 324/0.5 A
[58] Field of Search ........... 324/0.5 R, 0.5 A, 0.5 AH

[56] References Cited
U.S. PATENT DOCUMENTS 4,075,552    2/1978    Traficante ........................ 324/0.5 A Primary Examiner—M. Tokar
Attorney, Agent, or Firm—McAulay, Fields, Fisher & Goldstein

[57] ABSTRACT

The wide-band nuclear magnetic resonance spectrometer is used for determining the NMR frequency of a sample in an external magnetic field and comprises a transmitter for generating a signal having a frequency equal to the NMR frequency of the sample. A receiver receives the signal from the sample and a probe is provided for applying the signal from the transmitter to the sample and from the sample to the receiver. The probe comprises a detector in the form of a tank circuit for detecting the signal of NMR frequency from the sample and for coupling the detector to the receiver and for substantially matching the impedance of the receiver.

13 Claims, 5 Drawing Figures

WIDE-BAND NUCLEAR MAGNETIC RESONANCE SPECTROMETER

This application is a continuation-in-part of copending application Ser. No. 571,433, filed Apr. 24, 1975 and now U.S. Pat. No. 4,075,552, entitled Wide-Band Nuclear Magnetic Resonance Spectrometer.

The present invention relates to a nuclear magnetic resonance spectrometer and, more particularly, pertains to a nuclear magnetic resonance spectrometer having a probe that is wide-band in operation, and extremely simple in construction.

Nuclear magnetic resonance (NMR) spectrometers are utilized to determine the nuclear magnetic resonance frequency of various substances. The operation of such spectrometers is based upon the fact that the nucleus of a substance may have a net spin which gives rise to a nuclear magnetic moment. At room temperatures, the nuclei in a sample of the substance are divided between high and low energy states with the greater quantity of nuclei residing in the low energy state. When such substance is placed in an external magnetic field, the interaction between the magnetic field vector and the nuclear magnetic moment produces a torque which interacts with the angular momentum of the nucleus and causes the magnetic moment to precess about the applied field vector. If energy at the precession frequency or so-called resonance frequency is applied to the substance or sample, an exchange of energy occurs wherein energy is absorbed by the low energy nuclei which then rise to the high energy level. Since this condition is an unstable condition, the nuclei eventually fall back to the low energy state thereby radiating energy at the same resonant frequency.

In an NMR spectrometer, a sample of the unknown substance is placed in a magnetic field of known intensity. A transmitter is then swept through a frequency band and the transmitted signal is applied to the sample via a probe. The probe is inductively coupled to the sample. When the NMR frequency is reached, energy will be absorbed by the sample and will also be radiated by the sample. The received signal is applied to a receiver via the probe and indicates the NMR frequency of the sample. The value of the NMR frequency is then compared to the known NMR frequencies of different substances to identify the particular sample under consideration.

In order for the spectrometer to operate properly, the probe must be tuned to the particular NMR frequency under consideration. Since the transmitter is swept through an extremely wide band, in present day practice it has been found impractical to utilize a single probe. That is, since the signal returned by the probe to the receiver is of low amplitude, it is necessary that the impedance of the probe be matched to the impedance of the receiver in order to obtain maximum power transfer. As a result, present commercial spectrometers utilize a plurality of different probes depending upon the particular portion of the bandwidth that the transmitter is being swept through. This not only increases the overall cost of such spectrometers, but requires the operator to keep changing the probe each time the transmitter is swept through a different portion of the bandwidth.

In the copending application identified above, a wide-band probe was described that substantially eliminated the problem by minimizing the number of probes necessary to cover the entire bandwidth of operation. However, these probes were somewhat difficult to fabricate.

Accordingly, an object of the present invention is to provide an improved nuclear magnetic resonance spectrometer.

A more specific object of this aspect of the invention is the provision of an NMR spectrometer that utilizes a minumum number of elements for operation thereof.

A further object of the present invention is to provide a wide-band NMR spectrometer utilizing a single probe that may be used over substantially the entire bandwidth of the transmitter.

A further object of the present invention is the provision of a wide-band nuclear magnetic resonance spectrometer that is reliable in operation and economical to produce.

Another object of the present invention resides in the novel details of construction that provide a wide-band element for a spectrometer of the type described thereby substantially decreasing the overall cost of such devices.

Accordingly, a wide-band nuclear magnetic resonance spectrometer for determining the NMR frequency of a sample in an external magnetic field of the type under consideration comprises a system having transmitting means for generating a signal having a frequency equal to the NMR frequency of the sample. Receiving means is adapted to receive the signal from the sample and probe means is provided for applying the signal from the transmitting means to the sample and for applying the signal from the sample to the receiving means. The probe means comprises detecting means for detecting the signal of NMR frequency from the sample, and connecting means for coupling the detecting means to the receiving means and for matching the impedance of the probe to the receiving means.

A feature of the present invention resides in providing a wide-band element that may be utilized in existing constructions thereby converting such constructions to wide-band spectrometers.

Other features and advantages of the present invention will become more apparent from a consideration of the following detailed description, when taken in conjunction with the accompanying drawings, in which.

As noted above, the present invention relates to a wide-band nuclear magnetic resonance spectrometer. Accordingly, only those portions of a conventional spectrometer necessary for an understanding of the present invention will be discussed in detail herein. If the reader is interested in obtaining additional information on such spectrometers, the reader is referred to the text by Ruth Lynden-Bell and R. K. Harris, entitled NUCLEAR MAGNETIC RESONANCE SPECTROSCOPY, published by the Educational Division of Appleton-Century-Crofts, Meredith Corporation, 440

Park Avenue South, New York, New York 10016. Very briefly, however, spectrometers of the type under consideration include magnetic poles which produce a magnetic field of known intensity. Conventional feedback techniques are employed to maintain the magnetic field constant. A sample of the substance to be determined is placed between the poles of the magnet and is subjected to the constant magnetic field thereby producing a precession of the magnetic moment of the nuclei of the substance. A probe includes a coil that surrounds the sample. The sample may be contained in a vial or the like. The coil is electromagnetically coupled to the sample. A variable capacitor is connected in parallel with the coil to form a tank or resonant circuit that is resonant at the NMR frequency of the sample. A lead connects the probe to the remainder of the circuitry. As noted in greater detail below, a pulsed transmitter signal is applied to the probe via the lead and, when the frequency of the transmitted signal is equal to the NMR frequency of the sample, energy will be absorbed by the sample. Additionally, energy will be radiated from the sample and will be applied to the receiver via the lead.

The arrangement described above is known as a single coil system wherein the coil serves to couple energy to the sample and to remove energy from the sample. Alternatively, a two-coil system may be utilized wherein a first coil is oriented orthogonally to a second coil. The first coil is connected to the transmitter and the second coil is connected to the receiver so that energy is coupled to the sample via the first coil and is removed from the sample via the second coil.

Figure 1:
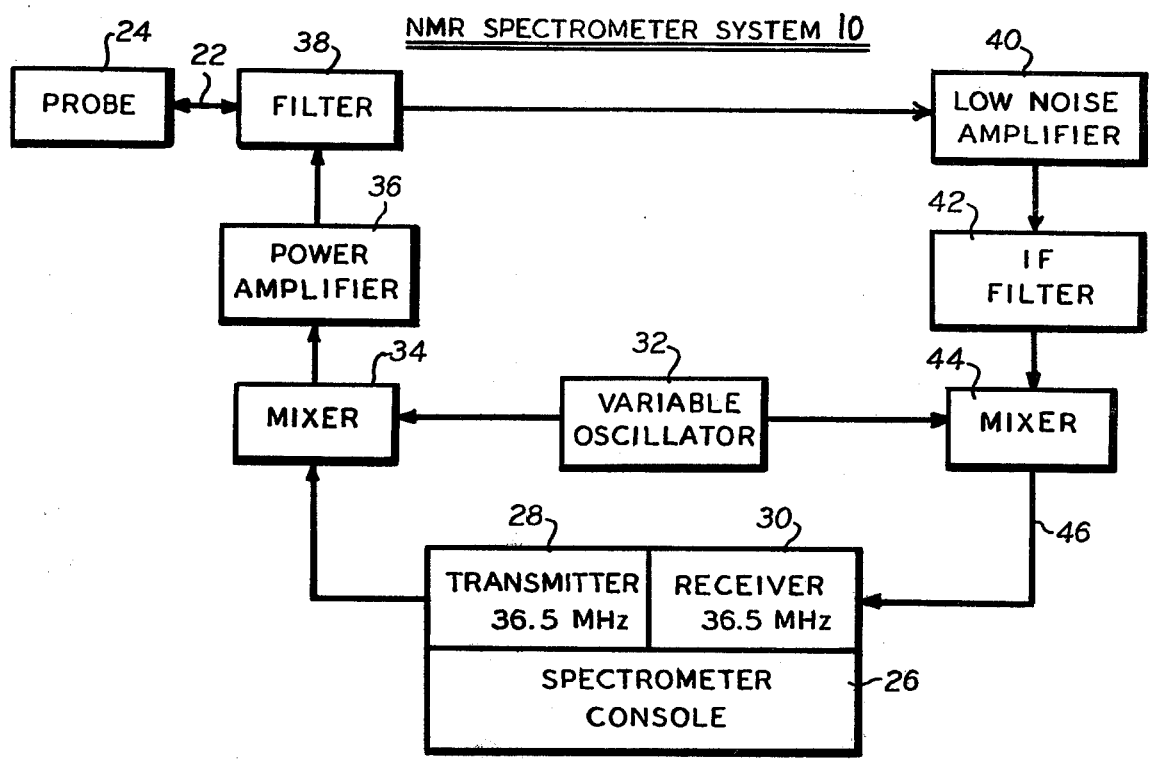
FIG. 1 is a schematic circuit wiring diagram, in block diagram form, showing the system of the present invention.

The system of the present invention is shown in FIG. 1 and is designated generally by the reference character 10. The system 10 is a coherent heterodyne system, as noted in greater detail below. The system 10 includes a spectrometer console 26 of known construction such as the Bruker HFX-90 NMR Spectrometer, manufactured by the Bruker Magnetics, Inc. Company of Burlington, Massachusetts. The spectrometer 26 includes a transmitter 28 that produces a 36.5 MHz signal and a receiver 30 that is adapted to receive the 36.5 MHz signal. A variable oscillator 32 is provided that is connected to both the transmitting and receiving chain to apply a coherent signal to both chains. More specifically, the transmitter 28 is connected to a mixer 34. The variable oscillator 32 is also connected to the mixer 34 so that the mixer produces signals having both the sum and the difference frequencies between the frequencies of the signals produced by the transmitter and the variable oscillator. The signals from the mixer 34 are applied to a power amplifier 36 that amplifies the signals at the mixer output and applies the same to a low-pass filter 38. The filter 38 passes only those frequencies in the band under consideration and applies signals having the desired frequencies to the probe 24 which is connected to the filter 38 via the lead 22.

Signals received by the probe 24 from the sample are applied to the filter 38 and, through the filter, to a low noise amplifier 40 which is connected to the output terminals of the filter. As noted in greater detail below, a reflecting device is provided in the filter and the low noise amplifier so that the transmitted signal from the amplifier 36 is reflected away from the input terminals of the low noise amplifier 40 and back to the probe 24 thereby preventing the high powered signals from the transmitting chain from entering the low noise amplifier. In other words, only signals radiated from the sample will be applied to the low noise amplifier 40 via the probe 24 and filter 38. The output terminals of the low noise amplifier are connected to an intermediate frequency or IF frequency filter 42. The output terminals of the filter 42 are connected to a mixer 44 in the receiving chain. The filter 42 is a low-pass filter that is set to attenuate image frequency noise signals from the amplifier 40. The mixer 44 also receives signals from the variable oscillator 32 and mixes the signals from the filter 42 and oscillator 32 to produce sum and difference frequency signals at the output terminals thereof which are connected to a receiver 30 via a lead 46.

As an example of the operation of the system 10, a sample of tin has an NMR frequency of 33.5 MHz. The variable oscillator 32 is set to a frequency of 70 MHz so that the output signals of mixer 34 have frequencies of 106.5 MHz and 33.5 MHz. These signals are amplified by the amplifier 36 and are applied to the low-pass filter 38. The low-pass filter 38 has a cut-off frequency that is slightly above the highest frequency in the band under consideration. Accordingly, the 33.5 MHz signal will pass through the filter whereas the 106.5 MHz will be attenuated by the filter. Energy from the transmitted signal will be absorbed by the sample via the probe 24 and energy at that frequency will also be radiated from the sample. Since the transmitter produces pulses, it is to be undertood that the signals radiated by the sample will be received during the intervals between transmitted pulses.

The radiated signal at 33.5 MHz will pass through the filter 38 and the low noise amplifier 40 and, through the IF filter 42 to the mixer 44. The filter 38 prevents undesired frequency signals that may be applied to the probe 24 by external circuits such as proton decoupling amplifiers, etc., from reaching the low noise amplifier 40, in addition to attenuating the unwanted output signals of the mixer 34. The filter 42, which is likewise a low-pass filter and has a cut-off at 50 MHz, prevents unwanted signals at the image frequency of 106.5 MHz from passing to the mixer 44. The 33.5 MHz signal applied to the mixer 44 is mixed with the signal of 70 MHz from the oscillator 32 to produce signals of 103.5 MHz and 36.5 MHz on the lead 46. The 36.5 MHz signal will be received by the receiver 30 which indicates to the operator that the sample under consideration does, in fact, have an NMR frequency of 33.5 MHz.

From the above example, it will become obvious that if the sample under consideration is changed to a sample having a different NMR frequency, only the setting on the variable ocsillator 32 need be changed. Since the probe and filter 38 are substantially wide-band, no changes need be made in these elements. Additionally, if the unwanted frequency from mixer 34 is substantially equal to the lock frequency (utilized to maintain the magnetic field constant) a notched filter may be placed either after mixer 34 or after the power amplifier 36.

Figure 3:
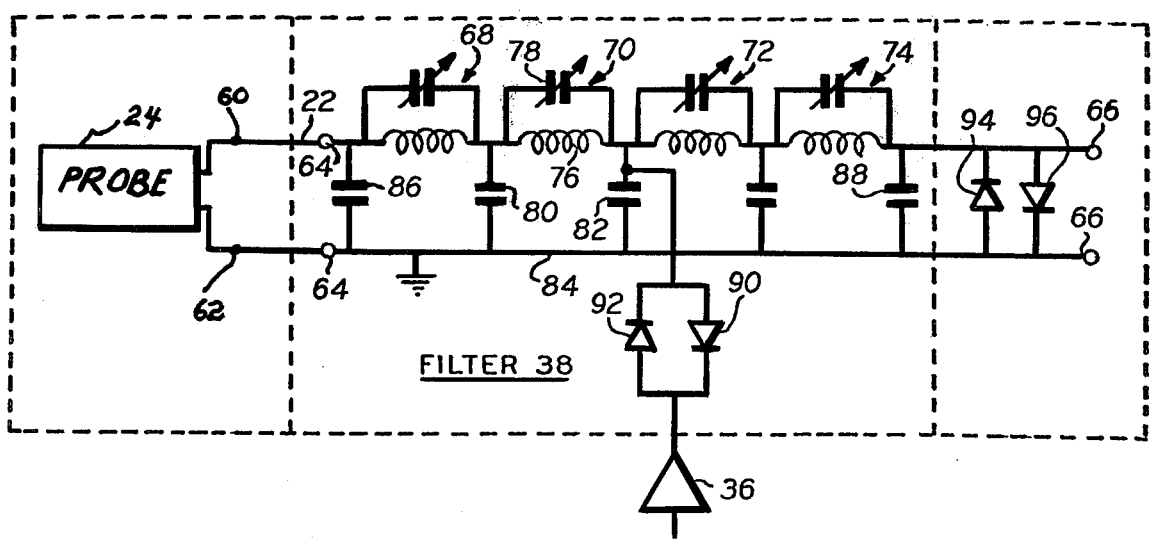
FIG. 3 is a schematic circuit wiring diagram of the probe and portions of the receiver of the present invention.
Figure 5:
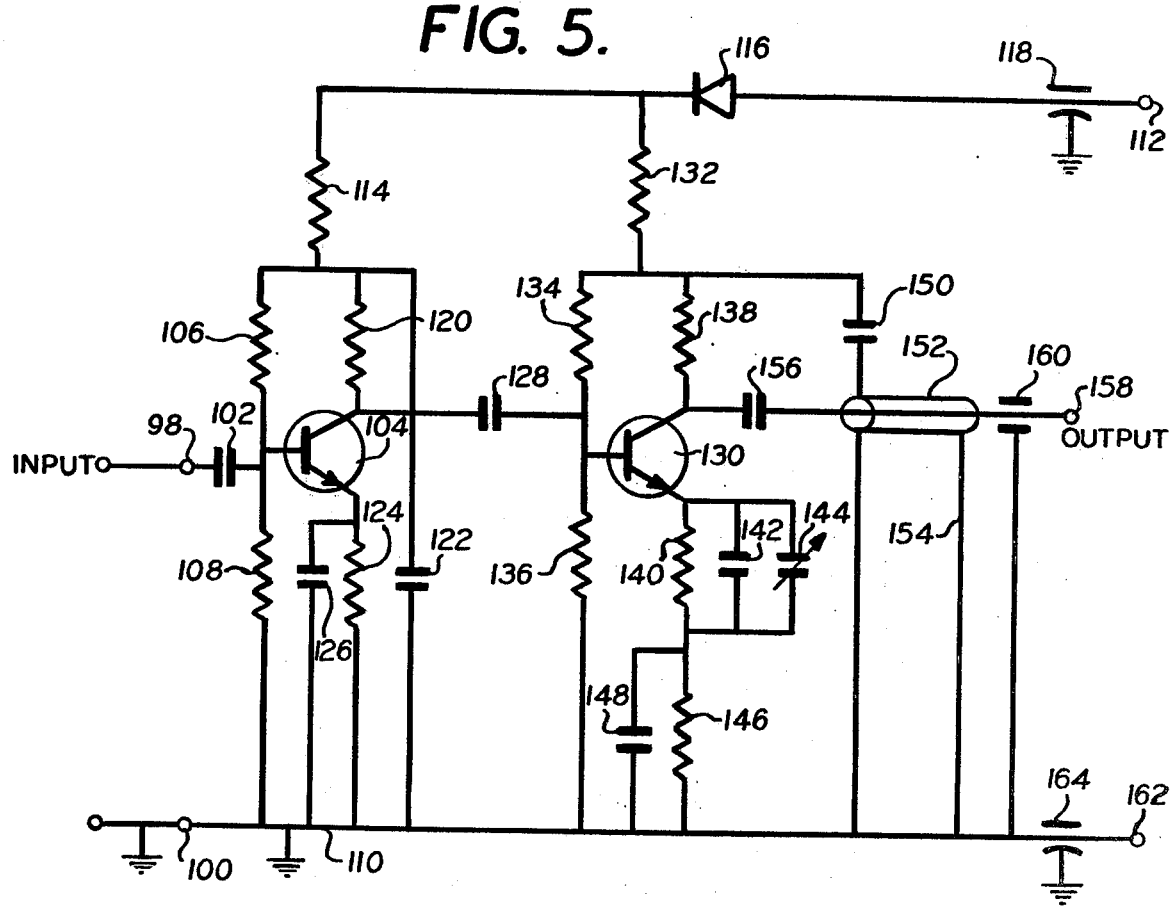
FIG. 5 is a schematic circuit wiring diagram of an amplifier that may be used in conjunction with the receiver of the present invention.

A schematic circuit wiring diagram of various elements comprising the system 10 are shown in FIGS. 3 and 5. More specifically, and as noted above, the signal radiated from the sample is of relatively low magnitude and it is imperative that the impedance of the probe be matched to the impedance of the remainder of the system. Prior art probes utilized a capacitive coupling between the signal detecting portion of the probe and the output terminals. This capacitive coupling influenced the impedance of the probe to a substantial degree over the range of frequencies under consideration. As a result, different probes were required to be used for different bands of frequencies. For a more detailed explanation of the probes of the prior art, the reader is referred to the inventor's article on the present system, entitled "An Approach to Multinuclei Capability in Modern NMR Spectrometers" by Daniel D. Traficante, James A. Simms, and Michael Mulcay in the Journal of Magnetic Resonance, Vol. 15, No. 3, published September, 1974 by the Academic Press, Inc.

As shown in FIG. 3, the probe 24 of the present invention is connected to a filter section 38 via the terminals 60 and 62. The probe 24 is shown in greater detail in FIGS. 2 and 4 and comprises a tank circuit comprising a variable capacitor 200 connected to serially connected coils 202 and 204. The coils are inductively isolated from each other. That is, there is no mutual inductance between coils 202 and 204. However, the coil 202 is inductively coupled with the sample. In other words energy is coupled to the sample and removed therefrom via the coil 202. The tank circuit, however, includes capacitor 200 connected in parallel with the series circuit of inductors or coils 202 and 204. The terminal 60 is connected to the junction of the coils by a lead 206 and a lead 208 connects the terminal 62 to the other end of the coil 204. Thus, the coil 204 serves to both tune the tank circuit and to match impedances to the receiver section via the filter 38.

Figure 2:
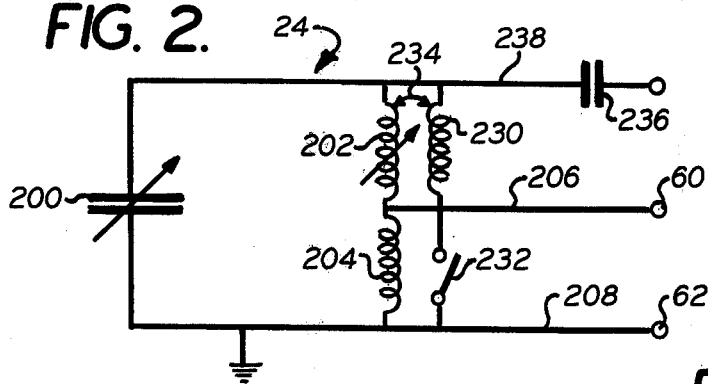
FIG. 2 is a schematic circuit wiring diagram of a probe constructed according to the present invention.
Figure 4:
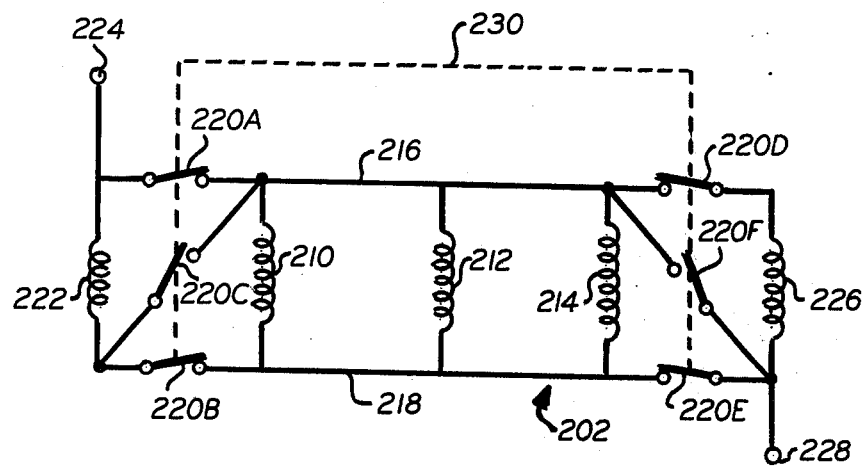
FIG. 4 is a schematic circuit wiring diagram of the variable inductance shown in FIG. 2.

Although shown as a single coil in FIG. 2, the coil 202 is actually a number of coils capable of being connected in two different configurations depending on the frequency range of operation. Thus, the construction of coil 202 is shown in FIG. 4 and comprises coils 210, 212 and 214 connected in parallel by leads 216 and 218. The lead 216 is connected through switch 220A to one side of a coil 222 and terminal 224. The other side of coil 222 is connected through a switch 220B to the lead 218, and through switch 220C to the junction of lead 216 and coil 210. In a like manner, a coil 226 is connected at one end to a terminal 228 and, through a switch 220E, to the lead 218. The other end of the coil 226 is connected through a switch 220F to the lead 218 and through a switch 200D to the junction of lead 216 and coil 214.

The switches 220A-220F are ganged together as indicated by the dash line 230. The state of switches 220C and 220F is opposite to that of switches 220A, 220B, 220D, 220E. That is, when switches 220C, 220F are open, the other switches are closed. However, when switches 220C, 220F are closed, the other switches are open. It will now become apparent that the state of the switches will determine the configuration of the individual coils comprising the coil 202. Thus, when switches 220C, 220F are open and the other switches closed, coils 222 and 226 are connected in parallel with coils 210, 212 and 214. On the other hand, when switches 220C, 220F are closed and the other switches open, the coils 222 and 226 are connected in series with the parallel connection of coils 210-214.

The terminal 224 is adapted to be connected to capacitor 200 and the terminal 228 is adapted to be connected to the junction of lead 206 and coil 204. Accordingly, the frequency range of the probe is determined by the setting of the switches 220A-220F. In an actual embodiment, when the switches were operated to connect coils 210-214, 222 and 226 in parallel, the probe was tunable over the range 8-40 MHz with a maximum of 10% loss in signal-to-noise (S/N) ratio for an amplifier with a 75 ohm input impedance. On the other hand, when it was desired to tune over the band 1-8 MHz, the switches were operated to connect coils 222, 226 in series with parallel coils 210-214. It was found that this latter arrangement could be tuned over the range 1-10 MHz with no more than 10% loss in S/N.

Each one of the coils 210-214, 222 and 226 comprised nine turns of Number 32 gauge wire. The coils measured 12 mm in both diameter and length. The coil 204 comprised five turns of Number 26 gauge wire. It measured 5 mm in diameter and 4 mm in length.

The complete tuning range of a spectrometer of the type under consideration is 1-90 MHz. In order to extend the range of the probe to the 40-90 MHz band, another coil is provided. More specifically, a coil 230 is adapted to be connected, through a single-pole single-throw switch 232, in parallel with the series connected coils 202 and 204. The coil 230 is mutually coupled with the coil 202, as indicated by double arrowhead 234. In an actual embodiment, the coil 230 was wound directly over the coil 202 and comprised two turns of Number 24 gauge wire. When the coil 230 is connected in circuit by closure of the switch 232, an additional coupling is required to impedance match the probe with the amplifier. Thus, a capacitor 236 is provided which is connected at one end to the junction of coils 202, 230 by a lead 238. The other end of the capacitor is connected to the terminal 60 and the lead 206 is disconnected therefrom. (When the coil 230 and capacitor 235 are connected in circuit for measurements in the 40-90 MHz band, the coils 210-214, 222 and 226 are in the configuration wherein all the coils are connected in parallel.)

Accordingly, depending on the switch settings of the probe, the single probe 24 may be used to tune over the entire band of operation of the spectrometer.

The filter 38 includes a pair of input terminals 64 and a pair of output terminals 66. Connected between the input terminals and the output terminals are a plurality of π-type filter sections 68-74. The sections are identical in constructions except for the value of the end capacitors, as noted in greater detail below, and comprises a series inductor 76 connected in parallel with a variable capacitor 78. The shunt leg of the filter section comprises respective capacitors 80 and 82 that are respectively connected between the ends of the series inductor and a lead 84 that, in turn, is connected to ground. As noted above, and is conventional, the end shunt capacitors 86 and 88 of the filter have a different value than the intermediate capacitors. The output terminal from the amplifier 36 is connected to the midpoint of the filter sections through a pair of diodes 90 and 92 that are connected in inverse parallel relationship. The diodes 90 and 92 serve two purposes. On one hand, the diodes prevent the output impedance of the amplifier 36 from mismatching the filter. Additionally, the diodes prevent any noise that might be generated by the amplifier 36 from degrading the low noise performance of the low noise amplifier 40.

Connected across the output terminals 66 of the filter are reflecting means in the form of diodes 94 and 96 that are connected in inverse parallel relationship. The diodes are selected so that they conduct when a transmitter signal is received from the amplifier 36. In other words, the diodes reflect the transmitted signal which may propagate toward the terminals 66 back to the probe 24. On the other hand, the diodes 94, 96 do not conduct when a signal from the probe is propagated through the filter sections. Accordingly, the probe signal passes through the low noise amplifier which is connected to the terminals 66.

In an actual construction, the elements comprising the filter 38 had the following values:

| Capacitors: | |
|---|---|
| 80, 82 | 36μμf |
| 86, 88 | 18μμf |
| 78 | 7–25μμf |
| Inductors: | |
| 76 | 0.2μH |
| Diodes: | |
| 90–96 | IN4148 |

The low noise amplifier may comprise, for example, the low noise amplifier manufactured and marketed by the United Development Corporation, of Lexington, Massachusetts 02173, and designated Model No. LNA-1. A schematic circuit wiring diagram of such amplifier is shown in FIG. 5 and comprises a pair of input terminals 98, 100 which are respectively connected to the output terminals 66 of the filter. The terminal 98 may be connected to the filter output through a feedthrough capacitor (not shown). Connected to the terminal 98 is a capacitor 102 which, in turn, is connected to the base electrode of a transistor 104. Also connected to the base electrode of a transistor 104 is the junction of serially connected resistors 106 and 108. The other end of the resistor 108 is connected to ground lead 110 which is connected to the input terminal 100. The other end of the resistor 106 is connected to a DC supply terminal 112 through a series circuit comprising a resistor 114 and a diode 116, the anode electrode of which is connected to the terminal 112. A feedthrough capacitor 118 is connected between the terminal 112 and the diode 116. A resistor 120 is connected between the junction of resistors 106 and 114 and the collector electrode of the transistor 104. A capacitor 122 is also connected between the junction of the resistors 106, 114 and the lead 110. The emitter electrode of the transistor 104 is connected to ground through a parallel circuit comprising a resistor 124 and a capacitor 126.

The collector electrode of the transistor 104 is connected to a second amplifying stage through a coupling capacitor 128. More specifically, the capacitor 128 is connected to the base electrode of a transistor 130. The bias for the base electrode of the transistor 130 is obtained through the series circuit comprising resistors 132, 134, and 136 which is connected between the cathode electrode of the diode 116 and the ground lead 110. The base electrode of the transistor 130 is connected to the junction of the resistors 134, 136. Additionally, a resistor 138 is connected between the junction of resistors 132, 134 and the collector electrode of the transistor. Connected between the emitter electrode and the ground lead 110 is a parallel circuit comprising a resistor 140, a capacitor 142 and a variable capacitor 144 all of which are connected in series with a parallel circuit comprising a resistor 146 and a capacitor 148. Additionally a capacitor 150 is connected, at one end, to the junction of resistors 132 and 138 and, at the other end, to the ground lead 110 through one end of the sheath of a coaxial cable 152. The other end of the sheath of the cable is connected to ground lead 110 through a lead 154. The central conductor of the cable 152 is connected to the collector electrode of the transistor 130 through a capacitor 156 and to the output terminal 158 through a feedthrough capacitor 160. Similarly, the ground lead 110 is connected to the output terminal 162 through a feedthrough capacitor 164.

In an actual construction of the low noise amplifier, the following values of elements was used:

| Resistors: | |
|---|---|
| 106 | 8.2K ohms |
| 108, 134 | 2.7K ohms |
| 114 | 1.2K ohms |
| 120 | 820 ohms |
| 124 | 470 ohms |
| 132, 146 | 470 ohms, ¼W |
| 136 | 4.7K ohms |
| 138 | 51 ohms |
| 140 | 56 ohms |
| Capacitors: | |
| 102, 122, 126, 128 148, 156 | 0.01μf |
| 142 | 56μf |
| 144 | 9–35μμf |
| Transistors: | |
| 130, 104 | 2N3866 |
| Diodes: | |
| 116 | IN4004 |
| Feedthrough Capacitors: | |
| 118, 164 | 1,000μμf |
| DC Supply | 24 volts |

Accordingly, a wide-band nuclear magnetic resonance spectrometer has been disclosed which can be utilized over the entire bandwidth of NMR frequencies with the use of a single probe.

While a preferred embodiment of the present invention has been shown and described, it will become obvious that numerous omissions, changes and additions may be made in such embodiment without departing from the spirit and scope of the present invention.

What is claimed is:

1. In a wide-band nuclear magnetic resonance spectrometer for determining the NMR frequency of a sample in an external magnetic field, a system comprising transmitting means for generating a signal having a frequency equal to the NMR frequency of the sample, receiving means for receiving the signal from the sample, and probe means for applying said signal from said transmitting means to the sample and for applying the signal from said sample to said receiving means, said probe means comprising serially connected coils connected across a capacitor to form a tank circuit resonant at the NMR frequency of the sample, one of said coils adapted to be inductively coupled to said sample for detecting the signal of NMR frequency from the sample, and another of said coils being inductively isolated from said one coil for applying the signal from the sample to said receiving means.

2. A system as in claim 1, in which said probe means comprises a third coil connected to said transmitting means and oriented orthogonally with respect to said one coil.

3. A system as in claim 1, in which said receiving means comprises reflecting means connected between said transmitting means and said probe means for reflecting said transmitting means signal to said probe means.

4. A system as in claim 3, in which said reflecting means comprises a filter having a pass band that includes said NMR frequency, said filter having output connections, and a pair of diodes connected in inverse parallel relationship across said output connections, whereby said diodes are rendered conductive when said transmitting means signal is applied thereto to reflect said signal back to said probe means and said diodes are rendered nonconducting when said signal is received from the sample.

5. A system as in claim 1, in which said one coil comprises a plurality of coils, and switch means for connecting said plurality of coils in different arrangements to change the total inductance of said plurality of coils to vary the resonant frequency of said tank circuit.

6. A system as in claim 5, in which said plurality of coils comprise at least a first pair of coils connected in parallel, and at least a second pair of coils adapted to be switched by said switch means between a first state wherein said second pair of coils are connected in parallel with said first pair of coils, and a second state wherein said second pair of coils are connected in series with said first pair of coils.

7. A system as in claim 1, in which said probe means comprises a third coil adapted to be connected in parallel with said serially connected coils and inductively coupled with said one coil, and lead means for connecting said parallel circuit of coils to said receiving means, said lead means comprising a serially connected capacitor between said parallel circuit of coils and said receiving means.

8. A wide-band probe for a nuclear magnetic resonance spectrometer of the type operating over a wide band of frequencies and having: spaced magnetic poles adapted to receive a sample having an NMR frequency therebetween, transmitting means for supplying energy to said probe, and receiving means having a preselected input impedance for receiving energy from said probe; said probe comprising coil means adapted to be inductively coupled to the sample and connected across a capacitor to form a tank circuit resonant at the NMR frequency of the sample to detect the signal of NMR frequency from the sample, said coil means comprising a first coil adapted to be inductively coupled to the sample, and a serially connected second coil inductively isolated from said first coil for applying said signal from said sample to the receiving means and for substantially matching impedances therebetween.

9. A wide-band probe as in claim 8, in which said first coil comprises a plurality of coils, and switch means for connecting said plurality of coils in different arrangements to change the total inductance of said plurality of coils to vary the resonant frequency of said tank circuit.

10. A wide-band probe as in claim 9, in which said plurality of coils comprise at least a first pair of coils connected in parallel, and at least a second pair of coils adapted to be switched by said switch means between a first state wherein said second pair of coils are connected in parallel with said first pair of coils, and a second state wherein said second set of coils are connected in series with said first set of coils.

11. A wide-band probe as in claim 10, in which each coil of said first and second pair of coils comprises nine turns of number 32 gauge wire, each one of said coils being 12 millimeters in diameter and length; said one coil comprising five turns of number 26 gauge wire and having a 5 millimeter diameter and a length of 4 millimeters.

12. A wide-band probe as in claim 8, in which said probe means comprises a third coil adapted to be connected in parallel with said first and second coils and inductively coupled with said first coil, and lead means for connecting said parallel circuit of coils to said receiving means, said lead means comprising a serially connected capacitor between said parallel circuit of coils and said receiving means.

13. A wide-band probe as in claim 12, in which said third coil is wound directly over said first coil and comprises two turns of number 24 gauge wire.

* * * * *